United States Patent [19]

Wargnier et al.

[11] Patent Number: 5,732,337
[45] Date of Patent: Mar. 24, 1998

[54] RECONFIGURABLE MIXER-FILTER-DECIMATOR

[75] Inventors: James Alfred Wargnier, Harrison Township; J. William Whikehart, Novi, both of Mich.

[73] Assignee: Ford Motor Company, Dearborn, Mich.

[21] Appl. No.: 513,258

[22] Filed: Aug. 10, 1995

[51] Int. Cl.$^6$ .................................................. H04B 1/16
[52] U.S. Cl. .................. 455/144; 455/188.1; 455/214; 455/266; 455/307; 455/324; 455/334; 375/328; 375/350; 329/317
[58] Field of Search .................. 455/142–144, 455/307, 312, 313, 323, 324, 334, 188.1, 205, 211, 214, 266, 303–6, 337; 375/235, 308, 328, 324, 332, 335, 356; 329/317; 364/724.13, 724.1

[56] References Cited

U.S. PATENT DOCUMENTS

| | | | |
|---|---|---|---|
| 4,406,019 | 9/1983 | Ide et al. | 455/245 |
| 4,592,074 | 5/1986 | Whikehart | 375/75 |
| 4,737,728 | 4/1988 | Nakamura et al. | 329/110 |
| 4,853,944 | 8/1989 | Lo et al. | 455/142 X |
| 4,881,191 | 11/1989 | Morton | 364/724.13 |
| 5,220,583 | 6/1993 | Solomon | 375/82 |
| 5,222,144 | 6/1993 | Whikehart | 381/15 |
| 5,487,023 | 1/1996 | Seckova | 364/724.13 |
| 5,557,642 | 9/1996 | Williams | 455/323 X |
| 5,614,862 | 3/1997 | Sun | 329/317 X |

OTHER PUBLICATIONS

"An Evaluation of Several Two–Summand Binary Adders", by J. Sklansky, IRE Trans. on Electronic Computers, Jun., 1960, pp. 213–231.

"A New Type of Digital Filter for Data Transmission", by Van Gerwen et al., IEEE Transactions on Communications, vol. Com–23, No. 2, Feb., 1975, pp. 222–234.

"A Digital Filter Structure Requiring Only m–Bit Delays, Shifters, Inverters, and m–Bit Adders Plus Simple Logic Circuitry", by P. R. Moon et al., IEEE Transactions on Circuits and Systems, vol. CAS–27, No. 10, Oct., 1980, pp. 901–908.

"Interpolation and Decimation of Digital Signals—A Tutorial Review", by Crochiere et al., Proceedings of the IEEE, vol. 69, No. 3, Mar., 1981, pp. 300–331.

"An Economical Class of Digital Filters for Decimation and Interpolation", Eugene B. Hogenbauer, IEEE Transactions on Acoustics, Speech, and Signal Processing, vol. ASSP–29, No. 2, Apr., 1981, pp. 155–162.

"Multirate Filter Designs Using Comb Filters", by Shuni Chu et al., IEEE Transactions on Circuits and Systems, vol. CAS–31, No. 11, Nov., 1984, pp. 913–924.

"Efficient and Multiplierless Design of FIR Filters with Very Sharp Cutoff via Maximally Flat Building Blocks", by P.P. Vaidyanathan, IEEE Transactions on Circuits and Systems, vol. CAS–32, No. 3, Mar., 1985, pp. 236–224.

"Multiplierless FIR Filter Structures Based On Running Sums and Cyclotomic Polynomials", by H. Babic et al., Signal Processing III: Theories and Applications, Elsevier Science Publishers B.V. (North Holland), EURASIP, 1986, pp. c2.9, 160–162, 1044–1047.

"Decimation For Bandpass Sigma–Delta Analog–To–Digital Conversion", by Schreier et al, IEEE Technical Article #CH2868–8, 1990, pp. 1801–1804.

*Primary Examiner*—Reinhard J. Eisenzopf
*Assistant Examiner*—Philip Sobutka
*Attorney, Agent, or Firm*—Mark L. Mollon; Roger L. May

[57] ABSTRACT

A digital mixer-filter-decimator (MFD) is disclosed which is reconfigurable so that it can be used in both modes of operation of a dual mode receiver such as an AM/FM receiver. In either mode of operation the MPD performs filtering and decimation operations on separate data streams containing alternate samples of a digital input data stream. In the FM mode a mixing operation is also enabled to produce a complex output comprising in-phase and quadrature components. The mixing operation is disabled in the AM mode and the filtered and decimated outputs are combined to provide a real output. The same decimator filter can be used in both modes.

7 Claims, 3 Drawing Sheets

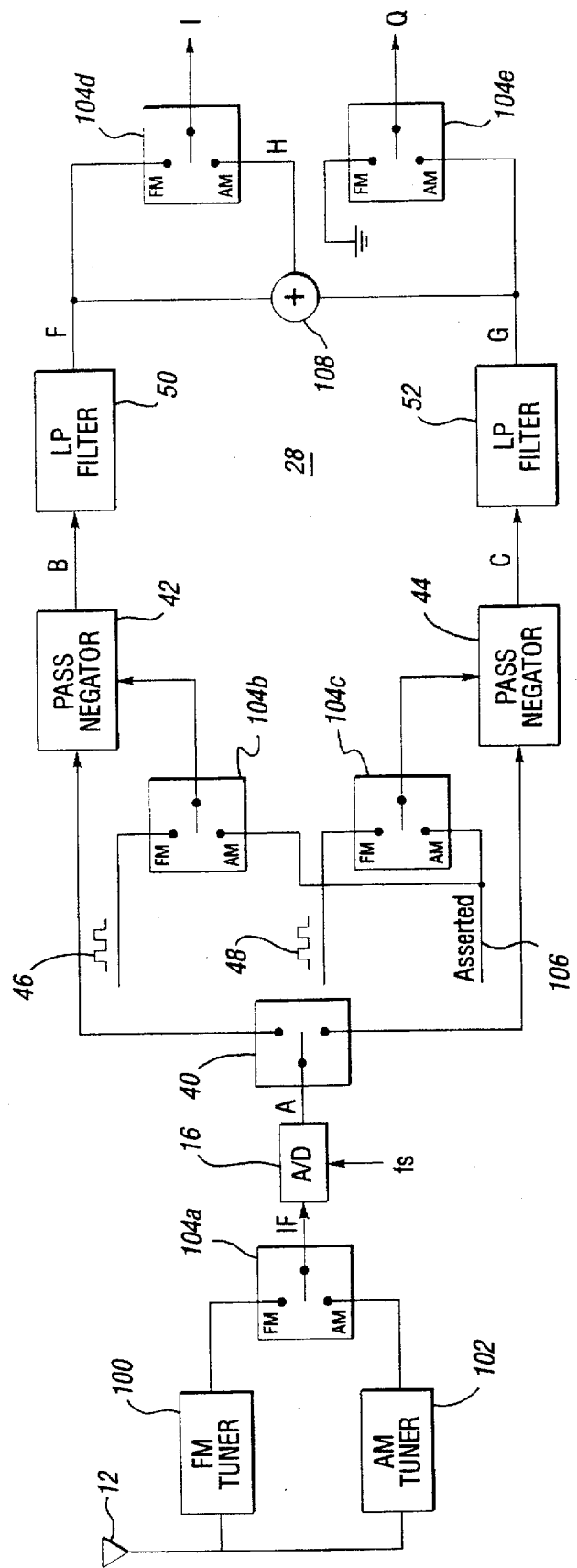

RECONFIGURABLE MIXER-FILTER-DECIMATOR

TECHNICAL FIELD

This invention relates to dual mode radio frequency receivers incorporating digital signal processing and more particularly to a mixer-filter-decimator (MFD) circuit that is reconfigurable to enable or disable the mixing function while using the same filter hardware in both modes.

BACKGROUND ART

In commercial AM and FM radio receivers, a band-limited signal is down-converted by mixing the received radio frequency (RF) signal with a sinusoid at a selected frequency and bandpass filtering the mixed signal such that the received carrier frequency is translated to an intermediate frequency (IF). The signal is then demodulated to provide the baseband signal.

Digital radio receivers have also been proposed that convert the received analog signal into a digital signal and perform digital signal processing (DSP) which permits the receivers to realize various advantages associated with digital circuits. See for example, Whikehart U.S. Pat. No. 5,222,144 assigned to the assignee of the present invention and incorporated herein by reference.

Receivers employing DSP perform mixing and filtering in the digital domain. The cost of implementing a particular receiver using DSP components increases with the amount of processing required to perform the desired functions. The processing load of a particular DSP system depends on the functions implemented and on the complexity of the implementation of these functions. In a receiver employing DSP, a received band-limited analog signal is sampled to produce a digital signal that is processed in DSP circuits. One typical approach is to sample a received band-limited analog signal at a rate two or more times higher than the bandwidth of the signal. The sampled signal is translated to a lower center frequency in the DSP circuits to allow further processing to be performed at a lower sample rate, thus lowering the cost of such processing. A decimation filter is often used to reduce the sample rate.

In a digital radio receiver, the sampled signal is typically a FM or AM IF signal from an analog tuner stage. Prior to initiating digital signal processing, the signal is converted to a digital signal using an analog-to-digital (A/D) converter. To minimize the processing rate required for IF filtering, the digital IF signal is digitally mixed to a nominal zero Hz complex IF frequency. This mixing is performed with a half-complex mixer which has the real digital IF signal as one input, and has a complex injection signal as the other input. By performing this mixing digitally, a nearly exact 90 degree relationship can be established with near perfect amplitude balance. Also, if the IF and mixing frequency are nominally one-quarter of the sampling rate, then the complex injection sequence, necessary to obtain digitally the zero Hz complex IF signal, will simply be 1,0,–1,0 . . . for the cosine injection sequence, and 0,–1,0,1 . . . for the sine injection sequence.

In an AM/FM receiver the AM IF signal is typically centered at 450 KHz and the FM IF signal at 10.7 MHz. In order to digitally process the signal it is desired to translate or down convert the IF signal to a nominal zero Hz IF. Translation typically consists of a mixing function followed by a filtering function. The filtering function removes undesired mixing products. When translation is followed by decimation filtering, the decimation filter provide the translator filter function. However, to accommodate both AM and FM signals, different amounts of translation are required. One DSP down conversion system is disclosed in co-pending patent application Ser. No. 08/084,903 filed Jul. 2, 1993 and assigned to the assignee of the present invention, and incorporated herein by reference. That system uses multiple MFD stages. It is desirable in an AM/FM receiver, employing such a system, to use common hardware to the greatest extent possible regardless of whether the AM or FM mode is selected. In both modes the input signal must be filtered and decimated but since the frequency content of the AM IF signal is already substantially lower than the FM signal, the down conversion function in the first MFD stage (of the multiple MFD stage system) required for the FM signal is not desired for the AM signal.

In accordance with the present invention, a MFD stage for an AM/FM receiver is reconfigurable to enable a mixing function in the FM mode and disable the mixing function in the AM mode while utilizing common filtering and decimation circuitry regardless of the mode selected.

SUMMARY OF THE INVENTION

In general the reconfigurable MFD of the present invention uses common hardware to process signals in two modes depending on the frequency content of the input signal in relation to the bandwidth of the decimation filter. In a first mode, the signal of interest contains frequency content higher than the decimation filter bandwidth and mixing is enabled such that after mixing, the signal of interest falls within the bandwidth of the decimation filter. When mixing is enabled, the mixer injection is complex (cosine and sine components), the mixer output is complex, and the following decimation filter is also complex. In a second mode, the frequency content of the input signal already falls within the bandwidth of the decimation filters and the mixing function of the MFD is not desired and thus is disabled. When mixing is disabled, and the MFD signal input is real, the MFD signal output is also real, and the following decimation filter is real. When employed in an AM/FM receiver, FM signals are processed with mixing enabled and AM signals are processed with mixing disabled. The filter coefficients are chosen to be symmetric so that the same filter hardware can be used in both modes by merely disabling the mixing function and adding the filter outputs when the AM mode is selected.

BRIEF DESCRIPTION OF THE DRAWINGS

A more complete understanding of the present invention may be had from the following detailed description which should be read in conjunction with the drawings in which:

FIG. 4 is a block diagram a preferred embodiment of an AM/FM receiver incorporating the reconfigurable mixer-filter-decimator of the present invention.

DETAILED DESCRIPTION OF PREFERRED EMBODIMENT

Figure 1:
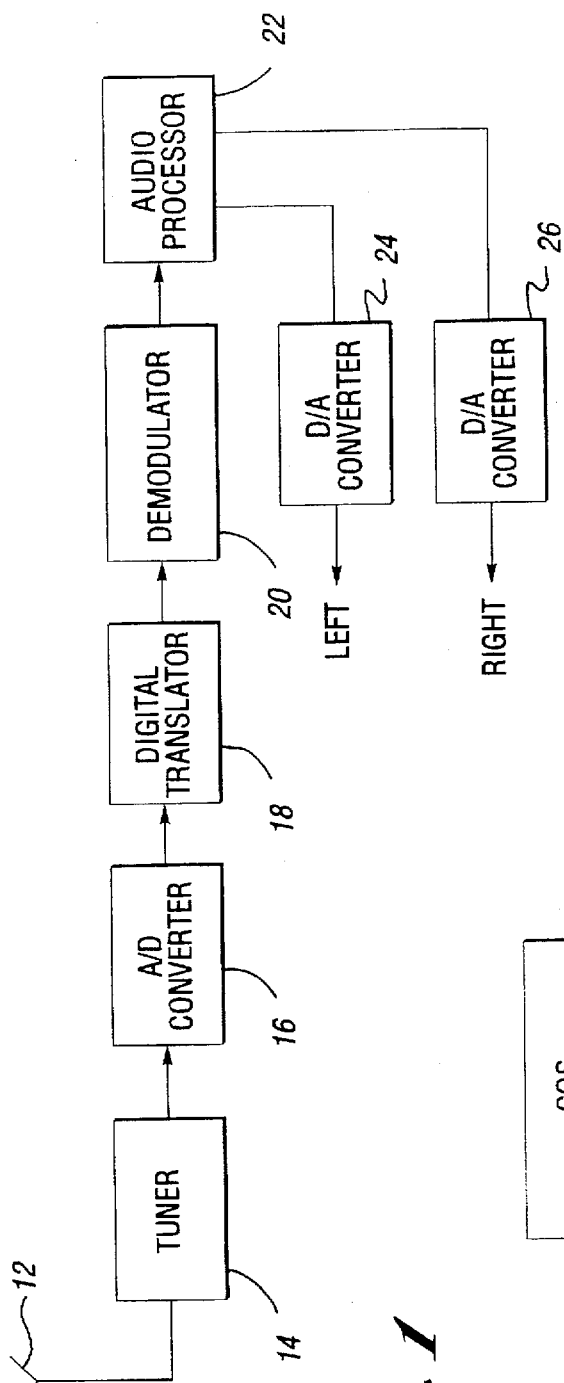
FIG. 1 is a block diagram of a conventional architecture for a digital signal processing receiver.

Referring now to the drawings, and initially to FIG. 1, a block diagram of a typical digital receiver is shown. An antenna 12 receives multiple radio broadcast signals. The input signals are coupled to a tuner 14 which partially selects the desired signal. The output from tuner 14 is an IF signal containing the desired channel signal and possibly undesired channels at different center frequencies. The analog output of the tuner 14 is sampled by an analog to digital converter 16 at a fixed rate, in order to produce a digital data stream containing a plurality of multi-bit data words representing the analog signal at the A/D input. A digital translator 18 translates the signal to a nominally zero Hz IF to facilitate subsequent digital signal processing. The subsequent processing circuitry typically includes a demodulator 20 which produces an audio signal. This signal is processed in the audio processor 22 after which the digital audio information is converted back to an analog signal by left and right converters 24 and 26. The analog signal is then amplified and fed to speakers (not shown).

The translator 18 may include a plurality of MFD stages as discussed in the aforementioned co-pending patent application. The first MFD stage generally designated 28, is shown in the block diagram of FIG. 2 and includes a half complex mixer 30 (real signal input and complex injection input, with complex output) which receives a real input sequence from the converter 16 at point A and provides outputs B and C. The input sequence can be expressed as follows:

$$x(n)=x(0),x(1),x(2),x(3), \qquad (1)$$

The outputs B and C provide inputs to finite impulse response (FIR) filters 32 and 34 respectively each of which implements the following equation:

$$y(n) = \sum_{m=0}^{N} h(m)V(n-m) \qquad (2)$$

where the filter coefficients are h(0), h(1), h(2) ... h(N), and V(n) is the filter input B or C.

The half complex mixer 30 has an injection frequency of $-fs/4$, where fs is the sampling rate of the converter 16. The injection signals are characterized by repeating cosine and sine sequences of the values 1,0,−1,0 and 0,−1,0,1 respectively. The resulting sequences at points B and C are:

$$B(n)=x(0),0,-x(2),0,x(4),0,-x(6),0, \qquad (3)$$

$$C(n)=0,-x(1),0,x(3),0,-x(5),0,x(7), \qquad (4)$$

Samples 7–10 of the outputs D and E of filter 32 using equation (2) where n=7 and the input sequence (3) are as follows:

$$D[7]=0 \cdot h(0)-x(6) \cdot h(1)+0 \cdot h(2)+x(4) \cdot h(3)+ \qquad (5)$$

$$D[8]=x(8) \cdot h(0)+0 \cdot h(1)-x(6) \cdot h(2)+0 \cdot h(3)+ \qquad (6)$$

$$D[9]=0 \cdot h(0)+x(8) \cdot h(1)+0 \cdot h(2)-x(6) \cdot h(3)+ \qquad (7)$$

$$D[10]=-x(10) \cdot h(0)+0 \cdot h(1)+x(8) \cdot h(2)+0 \cdot h(3)+ \qquad (8)$$

Likewise, four samples of the output of filter 34 using equation (2) and the input sequence (4) are as follows:

$$E[7]=x(7) \cdot h(0)+0 \cdot h(1)-x(5) \cdot h(2)+0 \cdot h(3)+ \qquad (9)$$

$$E[8]+0 \cdot h(0)+x(7) \cdot h(1)+0 \cdot h(2)-x(5) \cdot h(3)+ \qquad (10)$$

$$E[9]=-x(9) \cdot h(0)+0 \cdot h(1)+x(7) \cdot h(2)+0 \cdot h(3)+ \qquad (11)$$

$$E[10]=0 \cdot h(0)-x(9) \cdot h(1)+0 \cdot h(2)+x(7) \cdot h(3)+ \qquad (12)$$

At points F and G the outputs of the filters 32 and 34 are re-sampled by 2 to 1 decimators 36 and 38, which remove every other sample from the sequences. Thus, considering the filter outputs represented by the equations (5) through (12), the final outputs at point F are:

$$F[0]=D[7]=0 \cdot h(0)-x(6) \cdot h(1)+0 \cdot h(2)+x(4) \cdot h(3)+ \qquad (13)$$

$$F[1]=D[9]=0 \cdot h(0)+x(8) \cdot h(1)+0 \cdot h(2)-x(6) \cdot h(3)+ \qquad (14)$$

and at point G are:

$$G[0]=E[7]=x(7) \cdot h(0)+0 \cdot h(1)-x(5) \cdot h(2)+0 \cdot h(3)+ \qquad (15)$$

$$G[1]=E[9]=-x(9) \cdot h(0)+0 \cdot h(1)+x(7) \cdot h(2)+0 \cdot h(3)+ \qquad (16)$$

Examining equations (13) and (14), it can be seen that only the odd coefficients effect the output at F since all the even coefficients are multiplied by zero. Likewise only the even coefficients effect the output of G since the odd coefficients are always multiplied by zero. In addition the F output includes only the even input samples $-x[6];x[8];-x[10];\ldots$ and the G output includes only the odd input samples $-x[5];x[7];-x[9];\ldots$ where every other sample in both data streams are negated. Thus the mixing, filtering, and decimation functions, may be accomplished by selecting alternate input data samples at point A to form first and second separate data streams, negating alternate data samples in each of the streams and convolving the data streams with every other coefficient of the filter.

Figure 2:
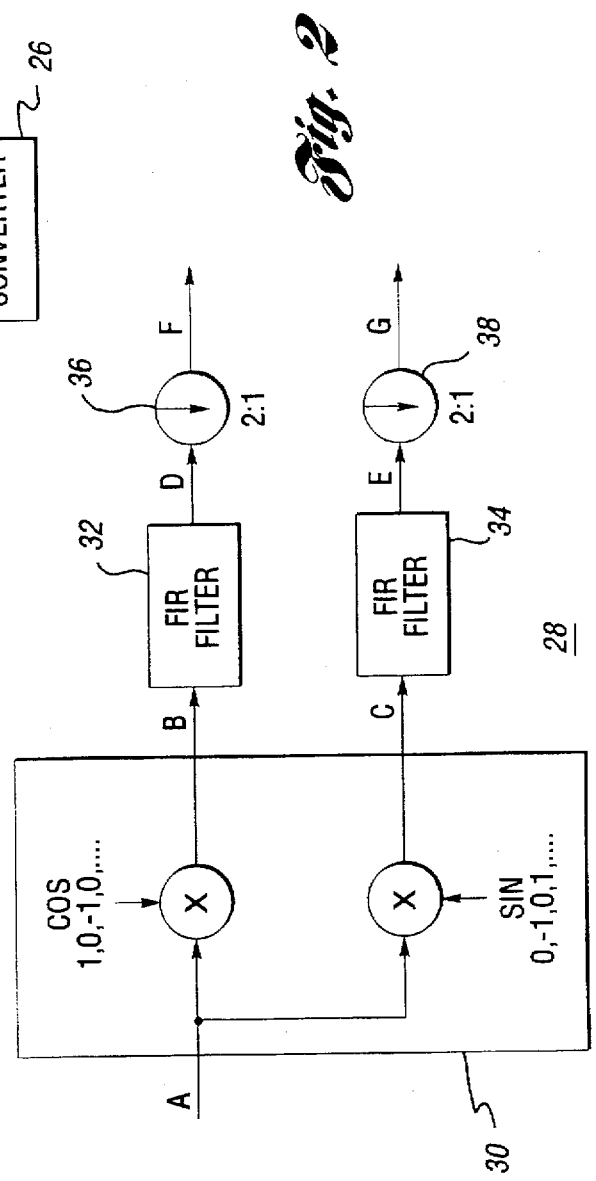
FIG. 2 is a block diagram of a mixer-filter-decimator stage useful in explaining the present invention.
Figure 3:
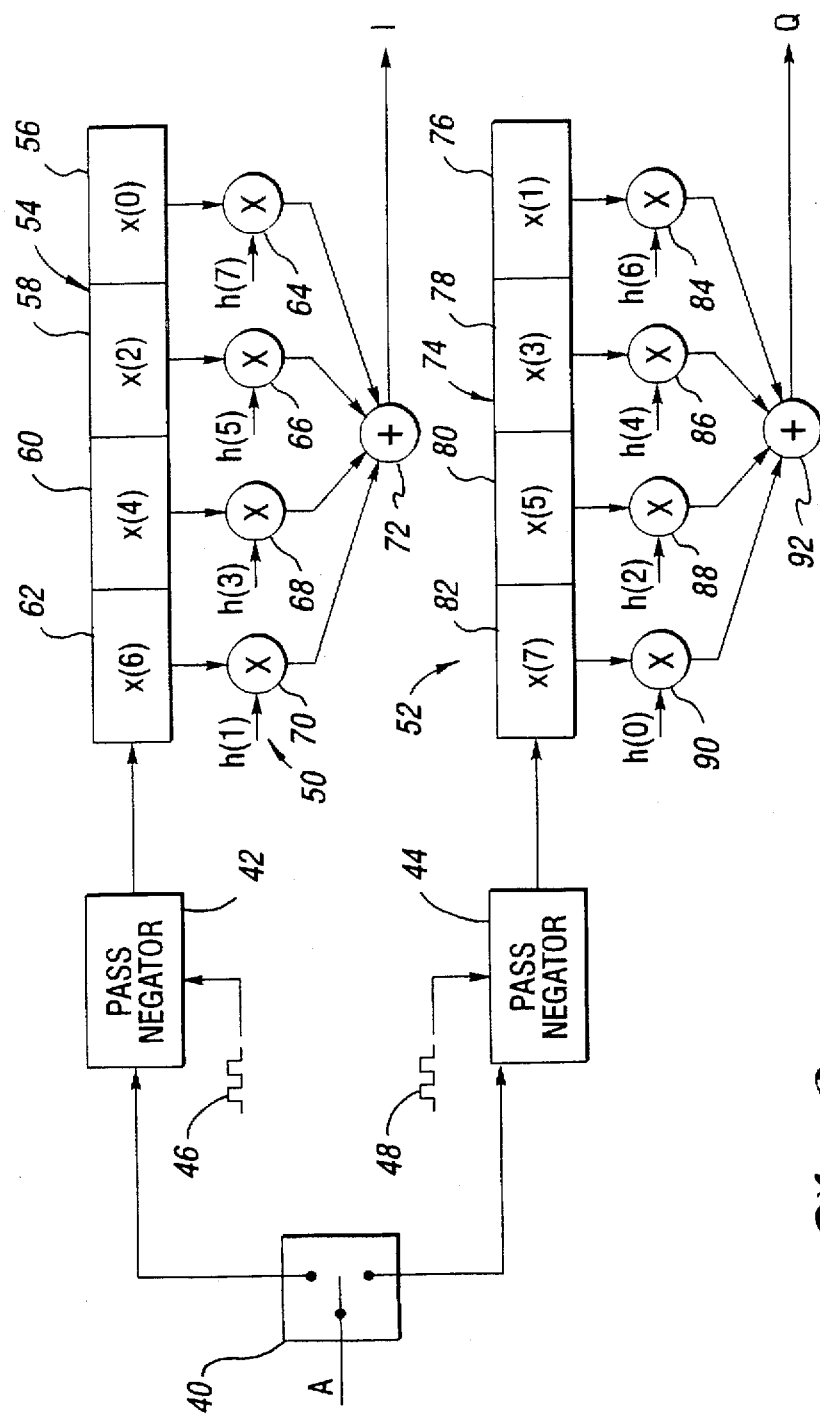
FIG. 3 is a mathematically equivalent implementation of the mixer-filter-decimator stage of FIG. 2.

Consequently, the MFD shown in FIG. 2 can be implemented by the circuitry shown in FIG. 3 where the input data at A is split into two separate data streams by a de-multiplexer 40 and the length of each filter has been reduced by a factor of 2. For purposes of discussion, it is assumed that de-multiplexer 40 directs the even numbered samples of the input data stream to a pass/negator logic device 42, and the odd numbered samples to a pass/negator logic device 44. The devices 42 and 44 are operated by control signals 46 and 48 respectively. Each of the signals 46 and 48 cause alternate samples of the data stream at the inputs to the devices 42 and 44 to be negated. The outputs of the devices 42 and 44 provide the input to FIR low pass filters 50 and 52. The filters 50 and 52 perform an anti-aliasing function determined by the coefficients h(0) to h(7). Coefficients h(0) to h(7) are determined according to the discussion in the previous paragraph. The filter 50 includes a shift register 54 having storage elements 56, 58, 60, 62. Four of the even numbered input data samples x(0), x(2), x(4), x(6) are indicated as being loaded into the respective storage elements 56–62. The even numbered samples are convolved by multiplying the samples x(0) to x(6) by odd numbered filter coefficients h(7) to h(1) respectively in multipliers 64–70. The outputs of the multipliers are summed in adder 72 to produce an in-phase component of the complex signal at A at a sampling rate equal to fs/4. Similarly, the filter 52 includes shift register 74 with element 76–82 storing odd numbered samples x(1) to x(7) for multiplication by even numbered filter coefficients h(6) to h(0) in multipliers 84–90 to obtain products which are summed in adder 92 to produce a quadrature component of the complex signal. It will be understood that the in-phase and quadrature components correspond to the data streams indicated at F and G respectively of FIG. 2.

The FIR filter represented by the combined filters 50 and 52 has an even number of coefficients and the coefficients are symmetric. The filter coefficients are determined according to known FIR decimation filter design methods to accomplish the anti-aliasing and decimation functions to be performed in the particular receiver. The filters 50 and 52 may have any number of taps. The relative numbering of samples to coefficients is arbitrary. That is, the multiplication of even numbered data samples by odd numbered coefficients and odd numbered data samples by even numbered coefficients is chosen to perform a convolution in accordance with the equations discussed above, and may be switched.

Equations (17) and (18) represent the addition of equations (13) and (15) and the addition of equations (14) and (16), respectively.

$$H[0]=F[0]+G[0]=x(7)\cdot h(0)-x(6)\cdot h(1)-x(5)\cdot h(2)+x(4)\cdot h(3)+ \quad (17)$$

$$H[1]=F[1]+G[1]=-x(9)\cdot h(0)+x(8)\cdot h(1)+x(7)\cdot h(2)-x(6)\cdot h(3)+ \quad (18)$$

Examination of equations (17) and (18) show that a typical FIR response is obtained, as described in equation (2), if the input data streams at points B and C are not negated by the pass/negators 42 and 44. Thus, the decimating filter used in the MFD can also be used where the mixing function is not required, if the outputs are added prior to further processing. The system shown in FIG. 4 utilizes this relationship to allow the same MFD to be used in either operating mode of an AM/FM receiver. When operating in the FM mode, the mixing function of the reconfigurable MFD is required. When operating in the AM mode the IF frequency is already sufficiently low enough that it is not desirable to mix the incoming signal. However, it is still necessary to decimate the sample rate for subsequent processing.

With reference to FIG. 4, an FM tuner 100 and an AM tuner 102 are coupled to the antenna 12. The tuner 100 produces an FM signal which is typically centered at an IF of 10.7 MHz while the tuner 102 produces an AM signal which is usually centered at 450 KHz. An AM/FM selector is generally represented by the switch blocks 104a–104e. Each switch block is simultaneously actuatable to an AM or FM position corresponding to a desired mode of receiver operation. The switch block 104e selects the output of tuners 100 or 102 as input to the A/D converter 16. When the FM mode is selected the operation of the MFD 28 is as discussed in connection with FIG. 3, producing a mixed, filtered and decimated in-phase component I and quadrature component Q at the output of switch blocks 104d and 104e, respectively. These complex components are thereafter subjected to further digital signal processing as discussed in FIG. 1 and in the aforementioned copending patent application.

If on the other hand the AM mode of operation is selected the relatively lower IF of the AM signal makes mixing of the AM signal undesirable in the first stage. In other words the AM signal is already within the bandwidth of the decimating filters 50 and 52 and consequently down converting or mixing in this stage is not desired. To disable the mixing function of the reconfigurable MFD, the negation function of the devices 42 and 44 is disabled by the assertion of a logic level input at 106 which causes all data samples to be passed directly to the filters 50 and 52. The I and Q component outputs of the filters 50 and 52 are summed in adder 108 to produce a final real output that is filtered and decimated.

The reconfigurable MFD can be applied to RF signals of any frequency, whether they are IF signals from an analog tuner, or RF signals taken from a receiver antenna.

Thus, the mixer-filter-decimator circuit of the present invention can be configured to operate in one mode (FM for example) to produce a complex output from a real input and in another mode (AM for example) to produce a real output from a real input while employing the same filter means in both modes of operation.

What is claimed is:

1. A receiver operable in first and second modes comprising:

analog RF processor means responsive to received analog input signals for generating first and second analog signals, said first signal having a frequency content which is relatively high with respect to the frequency content of said second signal;

analog to digital converter means;

selector means operable in said first mode to select said first analog signal for input to said converter means, and in said second mode to select said second analog signal for input to said converter means;

said converter means converting the analog input signal in either mode to a digital input signal including a plurality of samples; and a circuit which is reconfigurable by said selector means to perform mixing, filtering and decimating functions on said digital input signal when said selector means is in said first mode and to perform filtering and decimating functions on said digital input signal when said selector is in said second mode.

2. The receiver of claim 1 wherein said circuit comprises a de-multiplexer for separating alternate samples of said input into first and second digital data streams, first and second pass/negator means responsive to said first and second data streams respectively, said first pass/negator means respectively passing and negating alternate samples when said selector means is in said first mode and passing all samples when said selector is in said second mode, said second pass/negator means respectively passing and negating alternate samples when said selector means is in said first mode and passing all samples when said selector is in said second mode, finite impulse response filter means for convolving one of said first or second streams with even numbered filter coefficients and the other of said first or second stream with odd numbered filter coefficients, an adder for adding the outputs of said filter only when said selector is in said second mode.

3. The receiver of claim 2 wherein the digital input to said circuit in said first mode is a FM IF input signal and said circuit provides a complex output comprising separate filtered and decimated in-phase and quadrature components.

4. The receiver of claim 3 wherein the digital input to said circuit in said second mode is an AM IF input signal and said circuit provides a single output which is a filtered and decimated version of said input.

5. A reconfigurable mixer-filter-decimator circuit comprising:

de-multiplexer means for producing first and second data streams containing alternate samples of a input data stream;

a first pass/negator and a first finite impulse response decimation filter for processing said first data stream;

a second pass/negator and a second finite impulse response decimation filter for processing said second bit stream;

an adder for summing the outputs of said first and second decimation filters;

said circuit responsive to a first mode selection input to enable said first pass/negator to negate alternate samples of said first data stream and to enable said second pass/negator to negate alternate samples of said second data stream to provide separate in-phase and quadrature outputs at said first and second decimating filters; and said circuit responsive to a second mode selection input to enable said first and second pass/negators to pass all samples in said first and second data streams and to provide the output of said adder for further processing.

6. A reconfigurable mixer-filter-decimator circuit for selectively developing from a real input, either a filtered and decimated real output or a mixed, filtered and decimated complex output having an in-phase component and a quadrature component comprising:

- a de-multiplexer for producing first and second data streams containing alternate data samples of said input data stream;
- a first pass/negator and a first finite impulse response filter for processing said first data stream to produce a first output data stream;
- a second pass/negator and a second finite impulse response filter for processing said second data stream to produce a second output data stream;
- an adder for producing a third output corresponding to the sum of said first and second output data streams;
- said circuit responsive to a first mode selection input to enable said first pass/negator to negate alternate samples of said first data stream and to enable said second pass/negator to negate alternate samples of said second data stream to provide separate in-phase and quadrature component outputs at said first and second filters; and said circuit responsive to a second mode selection input to enable said first and second pass/negators to pass all samples in said first and second data streams and to provide said third output.

7. A reconfigurable mixer-filter-decimator circuit for selectively developing from a real input comprising a plurality of data samples, either a filtered and decimated real output or a mixed, filtered and decimated complex output having an in-phase component and a quadrature component comprising:

first means for separating said input data stream into first and second data streams containing alternate data samples of said input data stream;

second means responsive to a first mode selection input for negating alternate samples of the first and second data streams and including finite impulse filter means for convolving the samples in the first data streams with alternate coefficients of the filter to produce a first output data stream and convolving the samples in the second data streams with the remaining coefficients of the filter to produce a second output data stream;

said second means responsive to a second mode selection input for passing all samples of said first and second data streams without negation to said filter means and providing a third output equal to the sum of said first and second output data streams.

* * * * *